United States Patent
Nishi

(10) Patent No.: US 8,194,737 B2
(45) Date of Patent: Jun. 5, 2012

(54) APPARATUS AND METHOD FOR MODIFYING PREDICTED VALUES, AND DECODING SYSTEM

(75) Inventor: Takashi Nishi, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 429 days.

(21) Appl. No.: 12/382,663

(22) Filed: Mar. 20, 2009

(65) Prior Publication Data

US 2009/0238270 A1    Sep. 24, 2009

(30) Foreign Application Priority Data

Mar. 21, 2008    (JP) .................... 2008-073763

(51) Int. Cl.
*H04N 7/12*    (2006.01)
*H04N 11/02*    (2006.01)

(52) U.S. Cl. .............. 375/240.12; 375/240.25

(58) Field of Classification Search ........... 375/240.12, 375/240.25

See application file for complete search history.

(56) References Cited

OTHER PUBLICATIONS

Z. Xue, K. Loo, J. Cosman,"Embedded side information refinement for pixel domain wyner-ziv video coding towards umts 3g application," IEEE International Conf on Digital Object Identifier, pp. 156-159, 2007.*
Aaron et al., 'Transform-Domain Wyner-Ziv Codec for Video', Proc. SPIE Visual Communications and Image Processing, San Jose, California, 2004.
Adikari et al. 'A Sequential Motion Compensation Refinement Technique for Distributed Video Coding of Wyner-Ziv Frames', Proc. IEEE International Conference on Image Processing, Atlanta, Georgia, 2006, pp. 597-600.

* cited by examiner

*Primary Examiner* — Jay Patel
*Assistant Examiner* — Richard Torrente
(74) *Attorney, Agent, or Firm* — Rabin & Berdo, P.C.

(57)    ABSTRACT

An apparatus for modifying predicted values in a predicted image for input to a decoder starts by taking the most significant information bit plane from the predicted image and submitting it to the decoder to be decoded. Subsequent information bit planes are then taken in descending order and submitted to the decoder, but first each of these information bit planes is modified at the locations of prediction errors identified in the preceding information bit plane by comparing that information bit plane with the corresponding decoded bit plane. The modifications improve the general accuracy of the decoded image, enabling the decoder to decode the bit planes with less additional coded information than would otherwise be required. The apparatus is useful in distributed video coding systems.

6 Claims, 12 Drawing Sheets

FIG.11
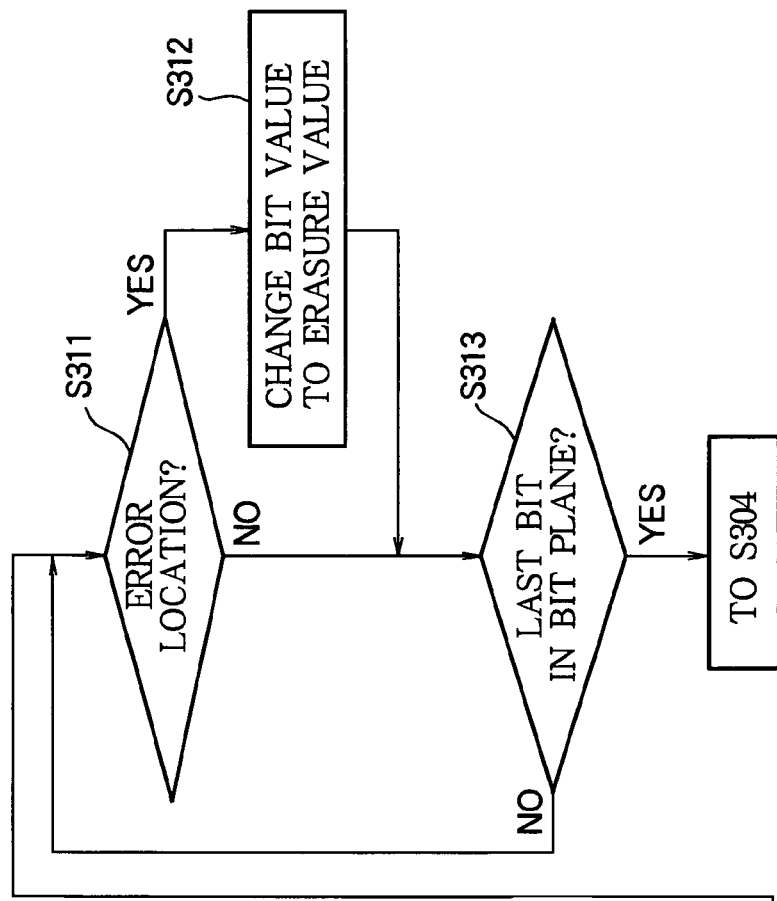
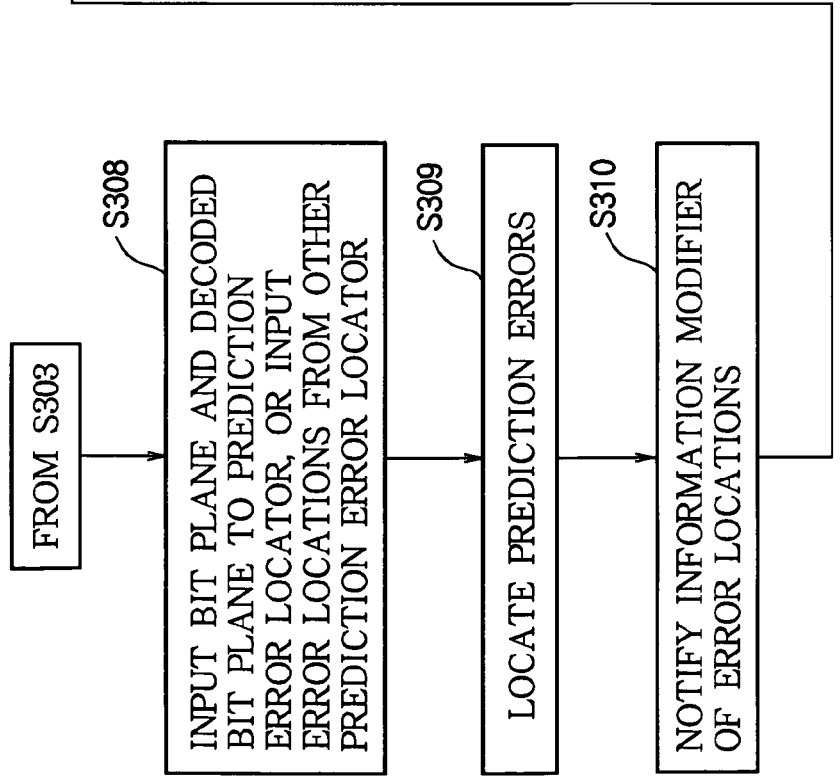

APPARATUS AND METHOD FOR MODIFYING PREDICTED VALUES, AND DECODING SYSTEM

BACKGROUND OF THE INVENTION

1. Field of the Invention

The present invention relates to the prediction of data in a decoding system of the type used with, for example, distributed video coding (DVC).

2. Description of the Related Art

Distributed video coding (DVC) is a new coding method that has grown out of coding theoretical research by Slepian and Wolf and further work by Wyner, Ziv, and others. In one DVC method, the encoder carries out only intraframe coding, while the decoder carries out both intraframe and interframe decoding. Distributed video coding has been attracting considerable attention because it can greatly reduce the computational load on the encoder.

An example of distributed coding is outlined in FIG. 1, which is taken from Aaron et al., 'Transform-Domain Wyner-Ziv Codec for Video', *Proc. SPIE Visual Communications and Image Processing*, San Jose, Calif., 2004. In the encoder, a video image sequence is divided into key frames, to which conventional intraframe coding and decoding are applied, and so-called Wyner-Ziv frames, to which Slepian-Wolf coding and decoding processes are applied. In the encoding process, a discrete cosine transform (DCT) is used to transform each Wyner-Ziv frame to the coefficient domain, the coefficients are grouped into bands, the coefficients in the k-th band are quantized by a $2^{M_k}$-level quantizer, the quantized coefficients ($q_k$) are expressed in fixed numbers of bits, and the bit planes are extracted and supplied to a Slepian-Wolf encoder that that produces information bits and error-correcting bits, called parity bits. The parity bits are stored in a buffer for transmission to the decoder. The information bits are conventionally discarded.

To decode a Wyner-Ziv frame, the decoder generates a predicted image by interpolation or extrapolation from one or more key frames, applies a DCT to convert the predicted image to the coefficient domain, groups the coefficients into bands, and inputs the coefficients in each band as side information to a Slepian-Wolf decoder. The Slepian-Wolf decoder requests the parity bits it needs to detect and correct errors in the side information. If necessary, further parity bits can be requested and the decoding process can be repeated until a satisfactorily consistent result is obtained.

Finally, the decoded values and the side information are both used to reconstruct the coefficients of the Wyner-Ziv frame, and an inverse discrete cosine transform (IDCT) is carried out to recover the image.

The accuracy of the predicted image (side information) generated by the decoder is known to be a major factor affecting the compression ratio in distributed video coding. The compression ratio can be improved by generating more accurate side information. Updating of the side information has therefore been proposed by Adikari et al. in 'A Sequential Motion Compensation Refinement Technique for Distributed Video Coding of Wyner-Ziv Frames', *Proc. IEEE International Conference on Image Processing*, Atlanta, Ga., 2006, pp. 597-600. As shown in FIG. 2, the proposed scheme involves a Slepian-Wolf decoder 101, a decoded image generator 102, a key frame decoder 103, a decoded image buffer 104, a side information generator 105, a side information updater 106, and a motion vector estimator 107. After each bit plane has been decoded, it is used to update the side information, and the motion vector estimator 107 uses the updated side information to perform motion estimation and compensation, thereby generating a new predicted image, from which the information bit extractor 108 obtains the predicted values of the information bits in the next bit plane.

By improving the accuracy of the predicted information bits in each successive bit plane, this scheme improves the compression ratio, but it imposes a very heavy computational load on the decoder, which must repeat the computationally intensive motion vector search and the motion compensation processing for each bit plane.

Another disadvantage is that the bit planes cannot be processed in parallel.

SUMMARY OF THE INVENTION

An object of the present invention is to provide a method and apparatus for generating improved predicted values of bit planes with less motion estimation and compensation processing.

Another object of the invention is to provide a method and apparatus for generating improved predicted values of bit planes in such a way that the bit planes can be processed in parallel.

The invention provides an apparatus for modifying predicted values in a predicted image for input to a decoder. The apparatus includes an information bit generator, a prediction error locator, and an information modifier.

The information bit generator obtains successive information bit planes from the predicted image, starting from the highest (most significant) information bit plane.

The prediction error locator receives decoded bit planes from the decoder and compares the decoded bit planes with the corresponding information bit planes to identify the locations of prediction errors in the information bit planes.

The information modifier modifies the values in each information bit plane, except the most significant bit plane, at the locations of prediction errors identified in a higher bit plane, and supplies the information bit plane, thus modified, to the decoder for use in decoding coded data, which the decoder receives separately.

The invention accordingly provides a method of modifying predicted values in a predicted image for input to a decoder that starts by taking the most significant information bit plane from the predicted image and supplying it to the decoder to be decoded. Subsequent information bit planes are then taken in descending order of significance, but before each of these information bit planes is supplied to the decoder, it is modified at the locations of prediction errors identified in a preceding (more significant) information bit plane, the prediction errors having been identified by comparing the preceding information bit plane with the corresponding decoded bit plane.

The invention also provides a decoding apparatus including one or more decoding units, a predicted image generator for generating a predicted image, and a decoded image generator for generating a decoded image from the outputs of the one or more decoding units. Each of the decoding units includes a decoder and the invented apparatus for modifying the predicted values in the predicted image.

BRIEF DESCRIPTION OF THE DRAWINGS

In the attached drawings:

FIGS. 9, 10, and 11 form a flowchart illustrating the decoding processing carried out in decoding units 2 and 3 in FIG. 8.

DETAILED DESCRIPTION OF THE INVENTION

Figure 1:
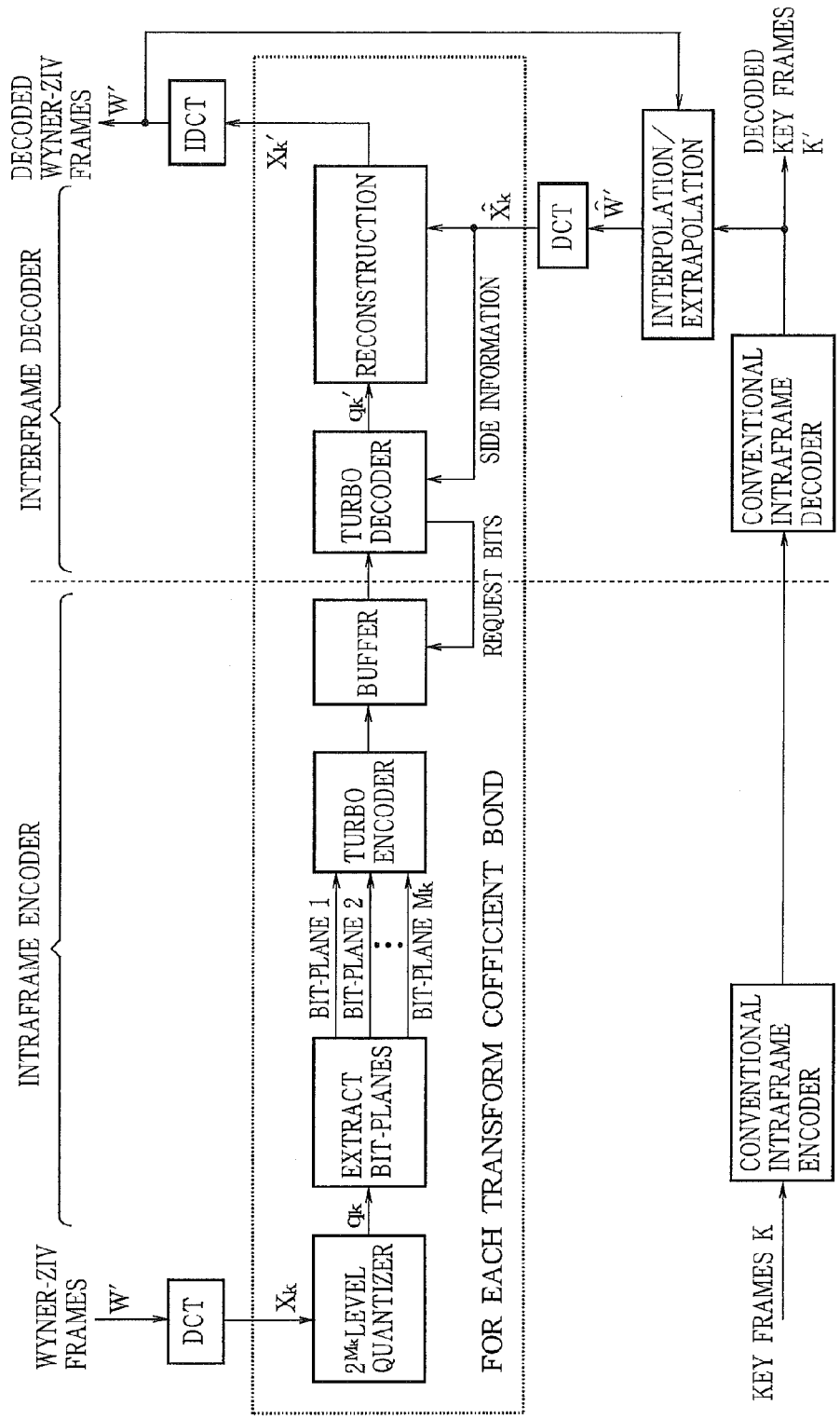
FIG. 1 is an explanatory diagram illustrating conventional distributed video coding and decoding.

Embodiments of the invention will now be described with reference to the attached drawings, in which like elements are indicated by like reference characters. The embodiments show decoding systems that use the inventive techniques for distributed video decoding of image data. The systems receive coded data for key frames and Wyner-Ziv frames, and output decoded image data.

First Embodiment

Figure 3:
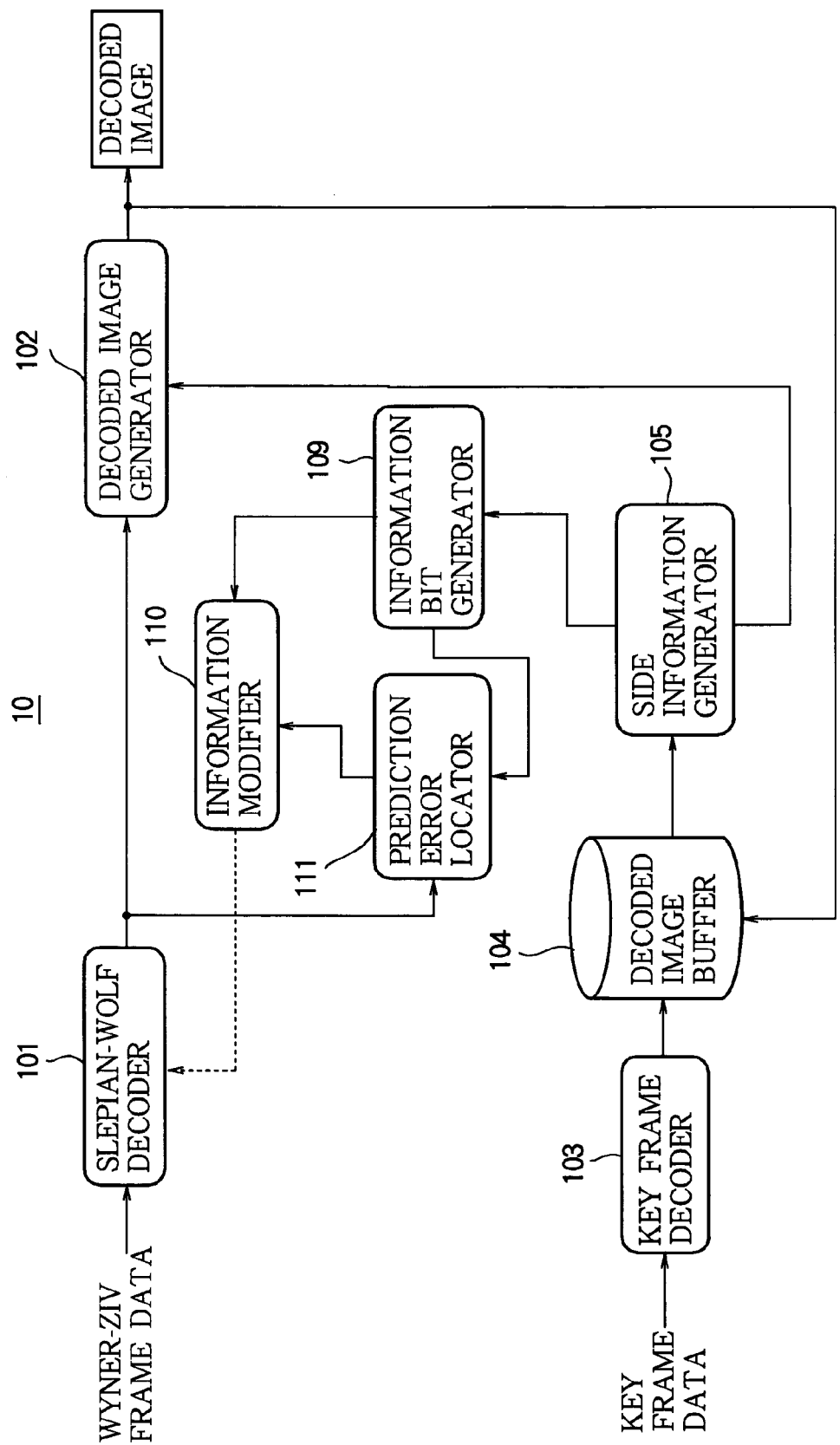
FIG. 3 is a block diagram illustrating the internal structure of a decoding system in a first embodiment of the invention.

Referring to FIG. 3, the decoding system 10 in the first embodiment comprises a Slepian-Wolf decoder 101 that receives coded data for Wyner-Ziv frames and performs Slepian-Wolf decoding, a key frame decoder 103 that receives and decodes coded data for key frames, a decoded image buffer 104 that stores decoded image data, a side information generator 105 that generates side information from the data stored in the decoded image buffer 104, a decoded image generator 102 that generates decoded image data from the outputs of the Slepian-Wolf decoder 101 and side information generator 105, an information bit generator 109 that obtains information bits for each bit plane, a prediction error locator 111 that compares the outputs of the Slepian-Wolf decoder 101 and information bit generator 109 to infer the locations of prediction errors, and a information modifier 110 that receives the outputs of the information bit generator 109 and prediction error locator 111 and generates the information bits input to the Slepian-Wolf decoder 101.

The component elements in FIG. 3 will now be described in more detail.

The Slepian-Wolf decoder 101 decodes Wyner-Ziv frames one bit plane at a time by using predicted values of the bits in each bit plane, which it receives from the information modifier 110, and coded data, which it receives from a coding system (not shown). The coded data may be a set of parity bits, for example. The Slepian-Wolf decoder 101 may be, for example, a turbo decoder operating according to a maximum a-posteriori probability (MAP) decoding algorithm, such as the Bahl-Cocke-Jelinek-Raviv (BCJR) algorithm.

The decoded image generator 102 receives decoded bit planes from the Slepian-Wolf decoder 101 and assembles them into decoded Wyner-Ziv frames, which it outputs as decoded images to, for example, a display apparatus. For key frames, the decoded image generator 102 receives and outputs data read from the decoded image buffer 104 by the side information generator 105.

The key frame decoder 103 decodes key frames by an intraframe decoding process. The decoded image buffer 104 receives the decoded key frame data from the key frame decoder 103 and the decoded Wyner-Ziv frame data from the decoded image generator 102, and temporarily stores the decoded frames.

The side information generator 105 uses motion estimation and other techniques to predict the data in a Wyner-Ziv frame from, for example, the decoded data for the nearest preceding and following frames that have already been decoded. The side information generator 105 obtains the necessary decoded data from the decoded image buffer 104. The predicted data constitute the side information for the Wyner-Ziv frame.

The information bit generator 109 collects the most significant bits of all the predicted data in a Wyner-Ziv frame to obtain a most significant bit plane for the frame, collects the second most significant bits of all the predicted data to obtain a second bit plane, and proceeds in this way through the least significant bit plane.

The information modifier 110 receives the bit planes one by one from the information modifier 110, modifies their values according to information received from the prediction error locator 111, and supplies the modified bit plane values to the Slepian-Wolf decoder 101.

The prediction error locator 111 receives each decoded bit plane from the Slepian-Wolf decoder 101 and compares it with the predicted values that the information bit generator 109 supplied for use in decoding the decoded bit plane. On the basis of this comparison, the prediction error locator 111 locates prediction errors and supplies their locations to the information modifier 110, for use in modifying the data in the next-lower bit plane.

The decoding process carried out by the b10 in the first embodiment will now be described with reference to the flowchart in FIGS. 4, 5, and 6.

Figure 4:
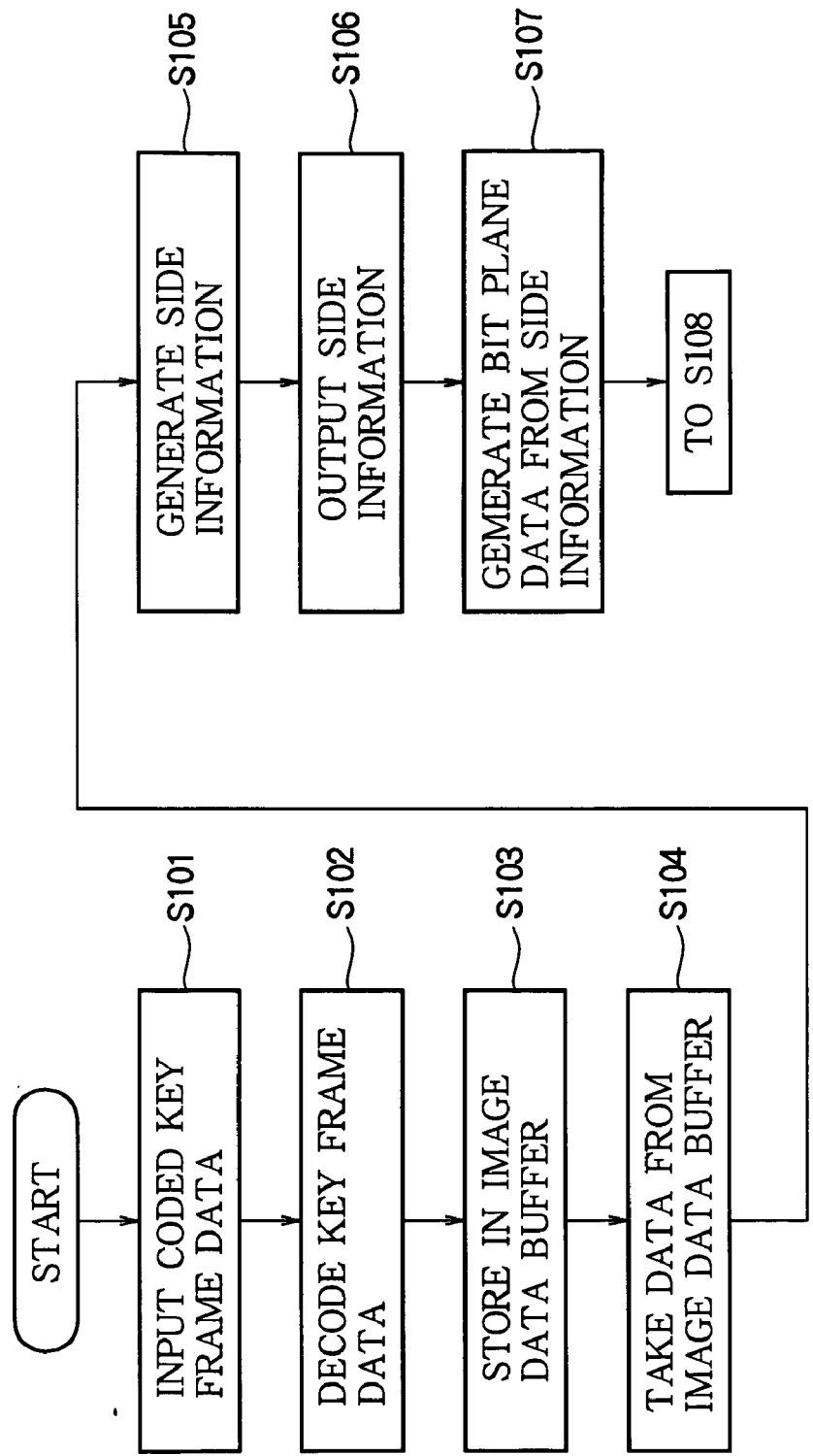
FIGS. 4, 5, and 6 form a flowchart illustrating the decoding process in the first embodiment.

Referring to FIG. 4, coded key frame data are input to the key frame decoder 103 (step 101) and decoded (step S102) The decoded key frame data are stored in the decoded image buffer 104 (step S103).

Next, part or all of the data stored in the decoded image buffer 104 are output to the side information generator 105 (step 104). The side information generator 105 generates side information by predicting the image data in the Wyner-Ziv frames (step S105).

To decode a Wyner-Ziv frame, the side information for the Wyner-Ziv frame is output from the side information generator 105 to the information bit generator 109 (step 106). The information bit generator 109 separates the side information into bit planes from the most significant or highest-level bit plane to the least significant or lowest-level bit plane (step 107). Different bit planes are decoded separately, in order from the most significant to the least significant.

Figure 5:
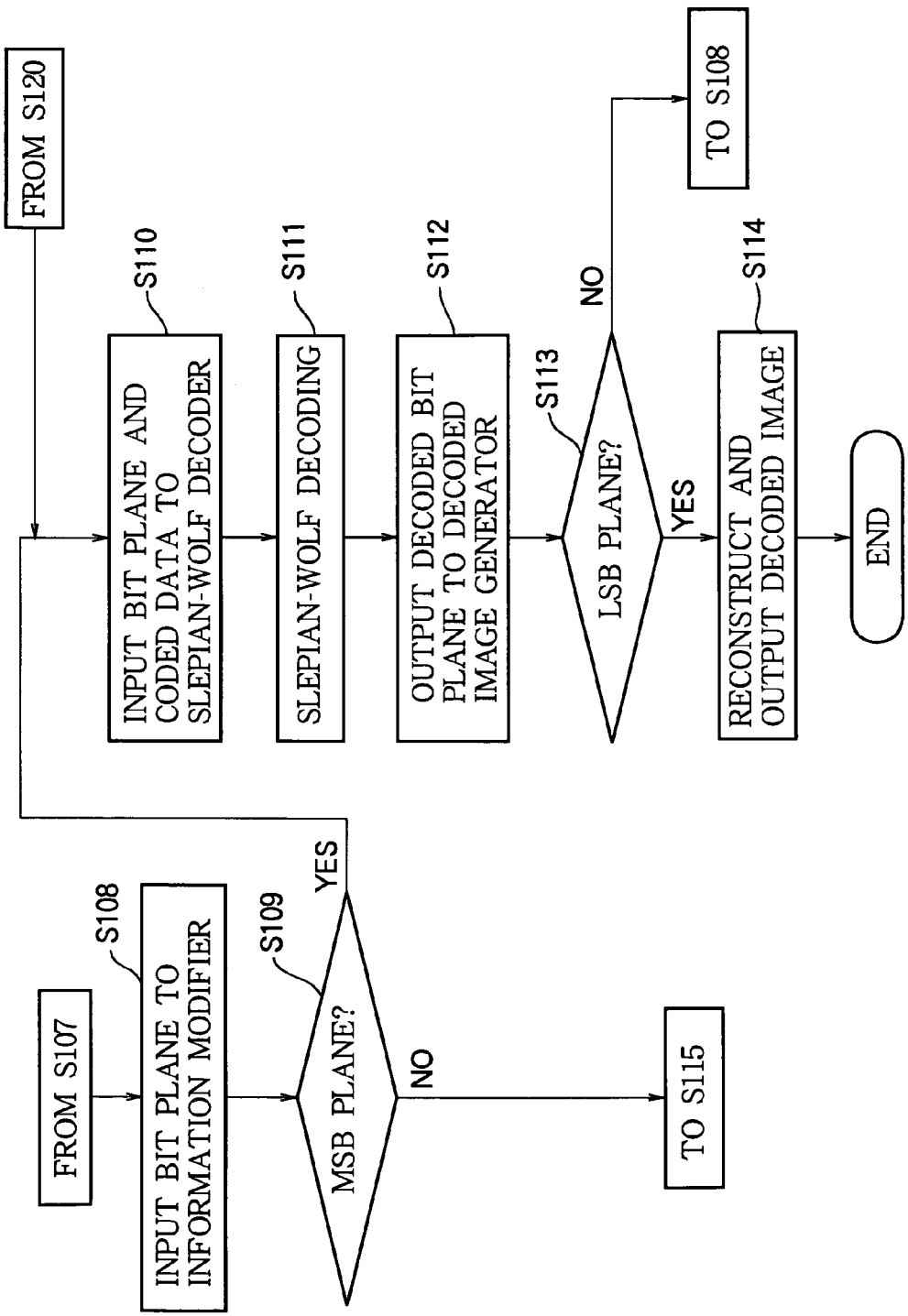

Referring to FIG. 5, to decode each bit plane, the side information in the bit plane is input from the information bit generator 109 to the information modifier 110 (step 108). The information modifier 110 operates differently depending on whether the bit plane is the most significant bit (MSB) plane or not (step S109). If the bit plane is the most significant bit plane, processing proceeds directly to step S110; otherwise, processing first proceeds to step S115 in FIG. 6.

In step S110, the information modifier 110 passes the bit plane data to the Slepian-Wolf decoder 101, which also receives coded data for the bit plane from the coding system. The Slepian-Wolf decoder 101 carries out a decoding process in which, essentially, it uses the coded data to detect and correct errors in the bit plane data received from the information bit generator 109 (step S111). The resulting decoded bit plane data are output to the decoded image generator 102 (step 112).

What happens next depends on whether the decoded bit plane is the least significant bit (LSB) plane or not (step S113). If the decoded bit plane is the least significant bit plane, processing proceeds to step S114; otherwise, processing returns to step S108 in FIG. 4 to decode the next-lower bit plane.

In step S114 the decoded image generator 102, having received decoded data for all bit planes from the Slepian-Wolf decoder 101, reconstructs and outputs the decoded image. This completes the decoding of the Wyner-Ziv frame.

Figure 6:
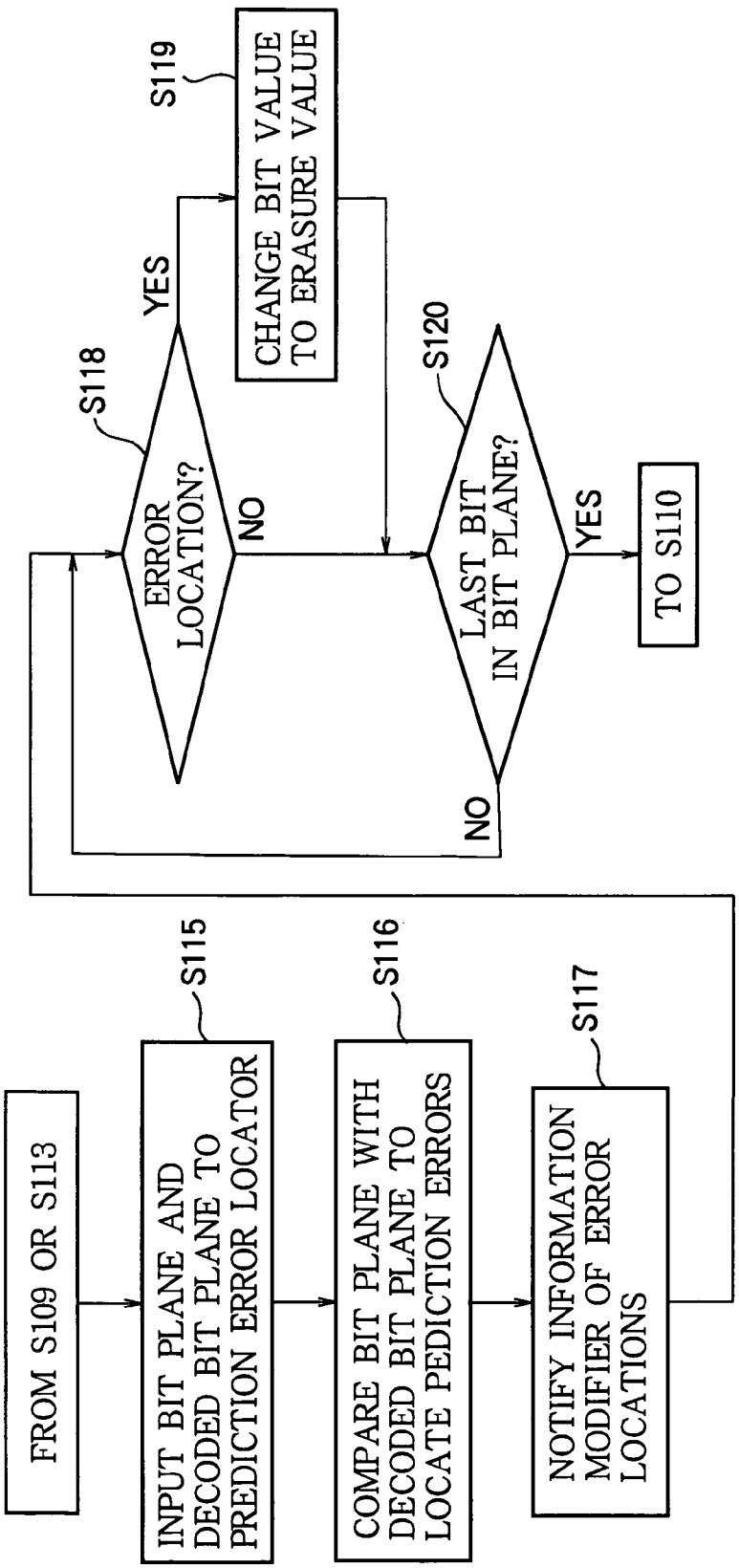

When processing returns from step S113 to step S108, the information modifier 110 obtains the next bit plane from the information bit generator 109, and since this next bit plane is not the most significant bit plane, processing proceeds from step S109 to step S115 in FIG. 6. In step 115, the information bit generator 109 and the Slepian-Wolf decoder 101 both give the prediction error locator 111 the bit plane data for the bit plane that has just been decoded, the Slepian-Wolf decoder 101 supplying the decoded data, the information bit generator 109 supplying the predicted but undecoded data generated as side information.

By comparing the decoded data with the predicted data, the prediction error locator 111 identifies prediction errors (step 116), and notifies the information modifier 110 of the locations of the prediction errors (step S117). These are the locations of prediction errors in the bit plane one level above the bit plane that the Slepian-Wolf decoder 101 will decode next.

Acting on the principle that where there was a prediction error in a bit plane, there may also be prediction errors in lower bit planes, the information modifier 110 now alters the values of the bits in these locations in the bit plane to be decoded next. The procedure is as follows. Taking the bits in the bit plane to be decoded one by one, the information modifier 110 decides whether each bit is located at the position of a prediction error in the preceding bit plane (step S118). If so, the predicted value of the bit is changed to an erasure value (step S119). Next, if the bit is not the last bit in the bit plane (step S120), the process returns to step S118 to process the next bit. When all bits in the bit plane have been processed, the process proceeds from step S120 to step S110 in FIG. 5, and the information modifier 110 passes the processed bit plane, including the modified values, to the Slepian-Wolf decoder 101.

Figure 7:
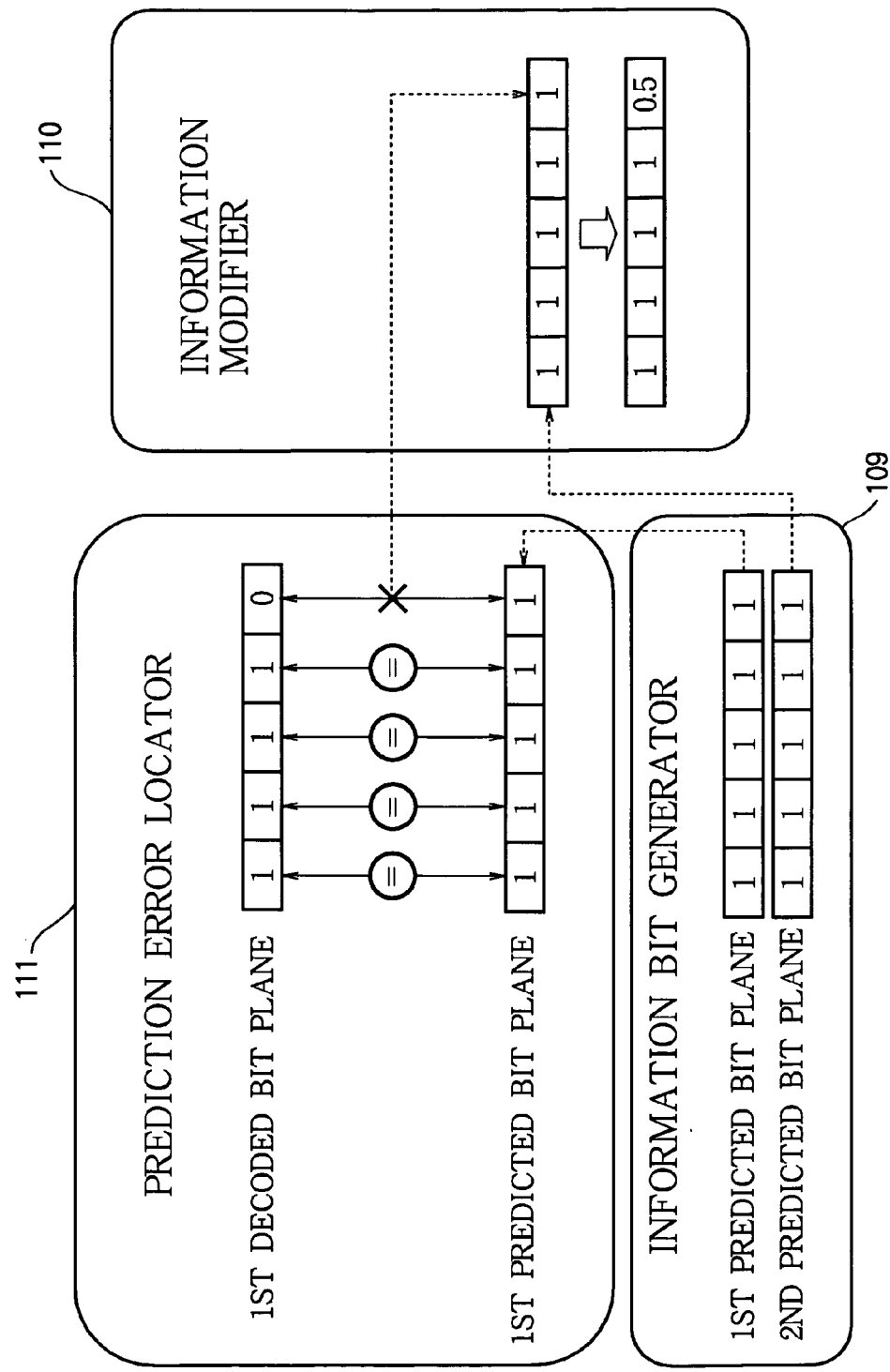
FIG. 7 is a diagram illustrating the identification of prediction error locations and the modification of bit plane values in the first embodiment.

FIG. 7 illustrates the process shown in FIG. 6. The information bit generator 109 has just supplied the predicted data for a first bit plane to the prediction error locator 111 and the predicted data for a second bit plane, one level less significant than the first bit plane, to the information modifier 110. The predicted bit data shown in both bit planes are all 1's. The information modifier 110 receives the decoded data for the first bit plane from the Slepian-Wolf decoder 101. The first four bits of decoded data are 1's, but the fifth bit is a 0. Comparing the predicted and decoded data, the prediction error locator 111 finds that the first four bits of predicted data match the decoded data, as indicated by the circled equal signs, but that there was a prediction error in the fifth bit, as indicated by the X-mark. The prediction error locator 111 notifies the information modifier 110 that the fifth bit was the location of a prediction error in the first bit plane. The information modifier 110 changes the predicted value in the same location in the second bit plane from 1 to 0.5, halfway between the normal bit values of 0 and 1. When the information modifier 110 passes this bit plane to the Slepian-Wolf decoder 101, the Slepian-Wolf decoder 101 will receive the erasure value (0.5) for the bit in this location, and will initially treat this bit as having an unknown value equally likely to be 0 or 1.

The erasure value need not be 0.5. For example, if bit values are represented algebraically, as +1 and −1, the erasure value may be 0.

Figure 2:
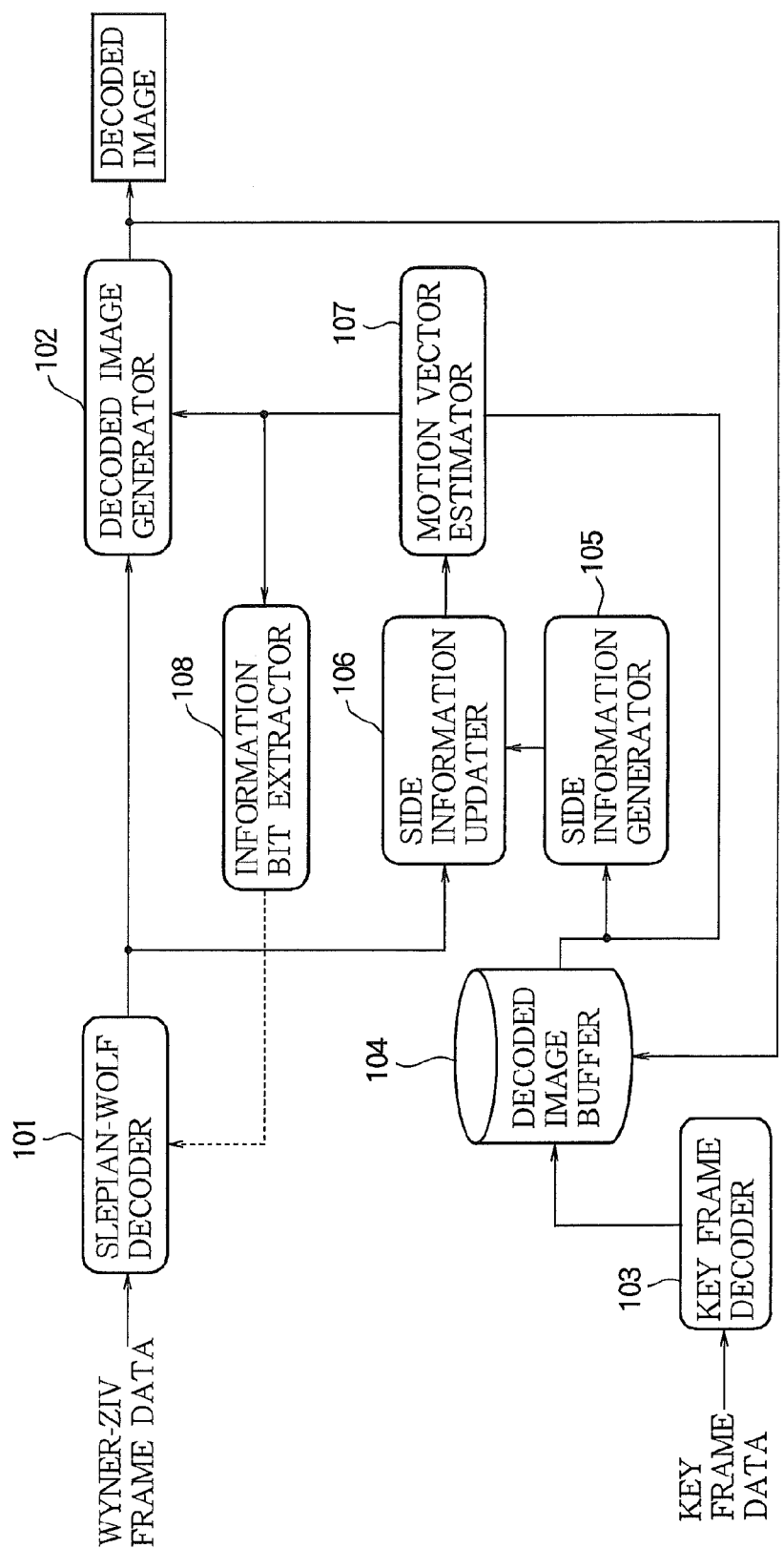
FIG. 2 is a block diagram illustrating a conventional decoding system.

Compared with the conventional decoder in FIG. 2 that performed motion estimation and compensation for every bit plane, the first embodiment has a reduced computational load because motion estimation and compensation are performed only once per frame.

Changing the values of predicted bits in locations where there were prediction errors in the preceding bit plane to erasure values halfway between the two possible bit values makes the predicted values more accurate in that the size of any prediction errors in these locations is reduced, e.g., from 1 to 0.5.

Second Embodiment

As a second embodiment of the invention, a parallel decoding system will be described.

Figure 8:
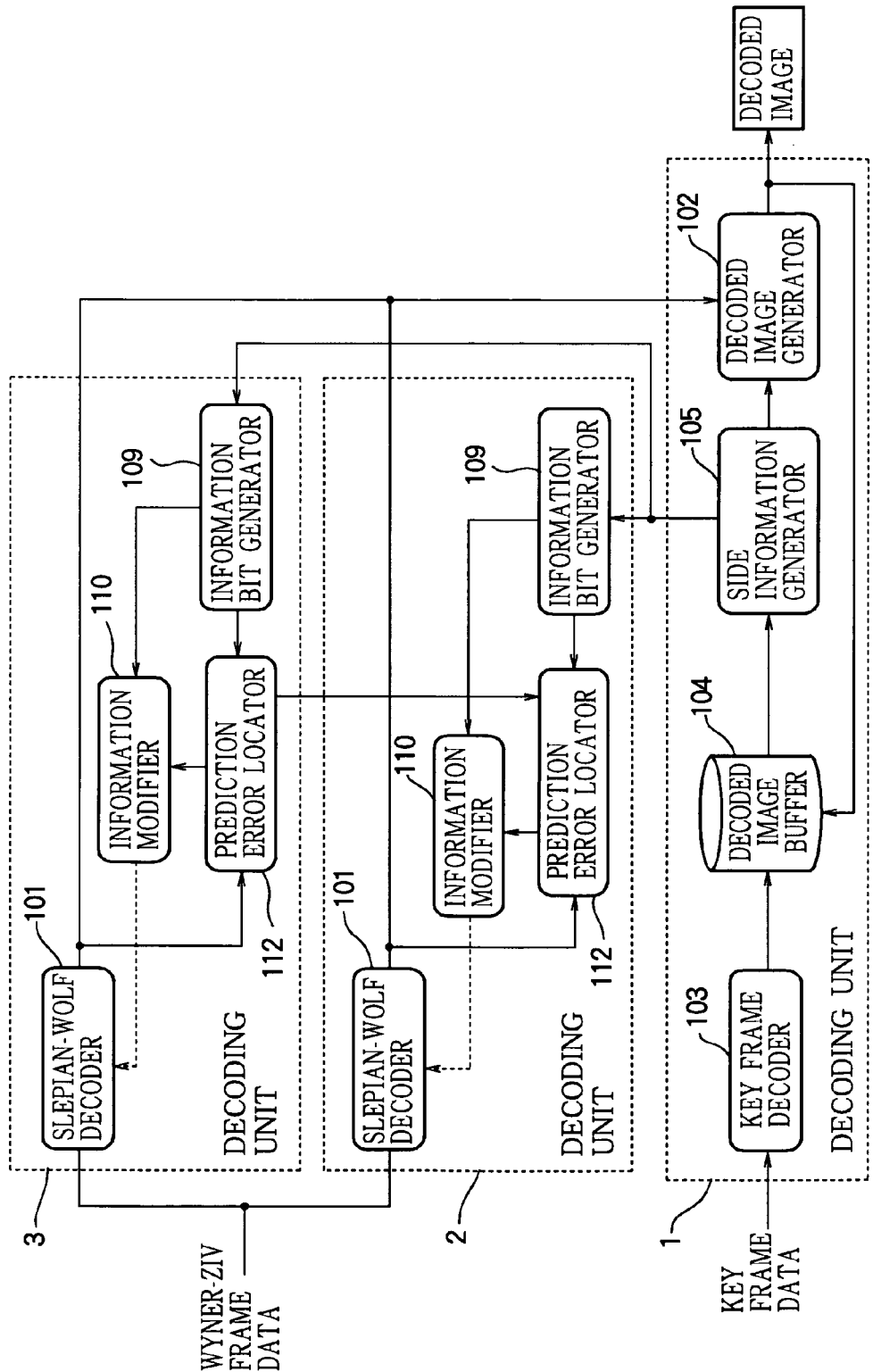
FIG. 8 is a block diagram illustrating the internal structure of a decoding system in a second embodiment.

Referring to FIG. 8, the decoding system 20 in the second embodiment comprises decoding units 1 to 3. Decoding unit 1 receives mainly coded data for key frames, generates side information and decoded image data, and supplies the side information to decoding units 2 and 3. Decoding units 2 and 3 receive coded data for Wyner-Ziv frames and the side information supplied from decoding unit 1 and perform Slepian-Wolf decoding based on the coded Wyner-Ziv frame data and the side information. In the description that follows, the decoding system 20 shown in FIG. 8 processes three consecutive bit planes in a Wyner-Ziv frame, of which the first bit plane is the most significant. Decoding unit 2 processes the first and second bit planes, and decoding unit 3 processes the third bit plane.

Decoding unit 1 comprises at least a key frame decoder 103 that decodes key frames, a decoded image buffer 104 that stores decoded image data, a side information generator 105 that generates side information from the data stored in the decoded image buffer 104, and a decoded image generator 102 that generates decoded image data from the outputs of decoding units 2 and 3 and the output of the side information generator 105.

Decoding units 2 and 3 each separately comprise a Slepian-Wolf decoder 101 that receives coded data for Wyner-Ziv frames and performs Slepian-Wolf decoding, an information bit generator 109 that obtains information bits for each bit plane, a prediction error locator 112 that compares the outputs of the Slepian-Wolf decoder 101 and information bit generator 109 to infer the locations of prediction errors, and an information modifier 110 that receives the outputs of the information bit generator 109 and prediction error locator 112 and generates the information bits input to the Slepian-Wolf decoder 101.

The input-output relations of the components in decoding units 1 to 3 will now be described. Decoding unit 1 will be described first.

The key frame decoder 103 comprises an input unit (not visible) that receives data for key frames and an output unit (not visible) that outputs data to the decoded image buffer 104.

The decoded image buffer 104 comprises an input unit (not visible) that receives data from the key frame decoder 103 and an output unit (not visible) that outputs data to the side information generator 105.

The side information generator 105 comprises an input unit (not visible) that receives data from the decoded image buffer 104, an output unit (not visible) that outputs data to the decoded image generator 102, and another output unit (not visible) that outputs data to decoding units 2 and 3.

The decoded image generator 102 comprises an input unit (not visible) that receives data from decoding units 2 and 3, another input unit (not visible) that receives data from the side information generator 105, and an output unit (not visible) that outputs decoded image data.

Decoding units 2 and 3 will be described next.

In each of these decoding units 2 and 3, the Slepian-Wolf decoder 101 comprises an input unit (not visible) that receives coded data for Wyner-Ziv frames, an input unit (not visible) that receives predicted data from the information modifier 110, an output unit (not visible) that outputs decoded data to the decoded image generator 102, and an output unit (not visible) that outputs decoded data to the prediction error locator 112.

The information bit generator 109 comprises an input unit (not visible) that receives side information from decoding unit 1, an output unit (not visible) that outputs predicted bit plane data to the information modifier 110, and an output unit (not visible) that outputs predicted bit plane data to the prediction error locator 112.

The information modifier 110 comprises an input unit (not visible) that receives predicted bit plane data from the information bit generator 109, and an input unit (not visible) that receives prediction error location data from the prediction error locator 112.

The prediction error locator 112 comprises an input unit (not visible) that receives predicted bit plane data from the information bit generator 109 and an output unit (not visible) that outputs prediction error location data to the information modifier 110. The prediction error locators 112 in decoding units 2 and 3 also include input and output units that exchange data between them.

The decoding process carried out in the second embodiment will now be described with reference to the flowchart in FIGS. 9, 10, and 11.

Figure 9:
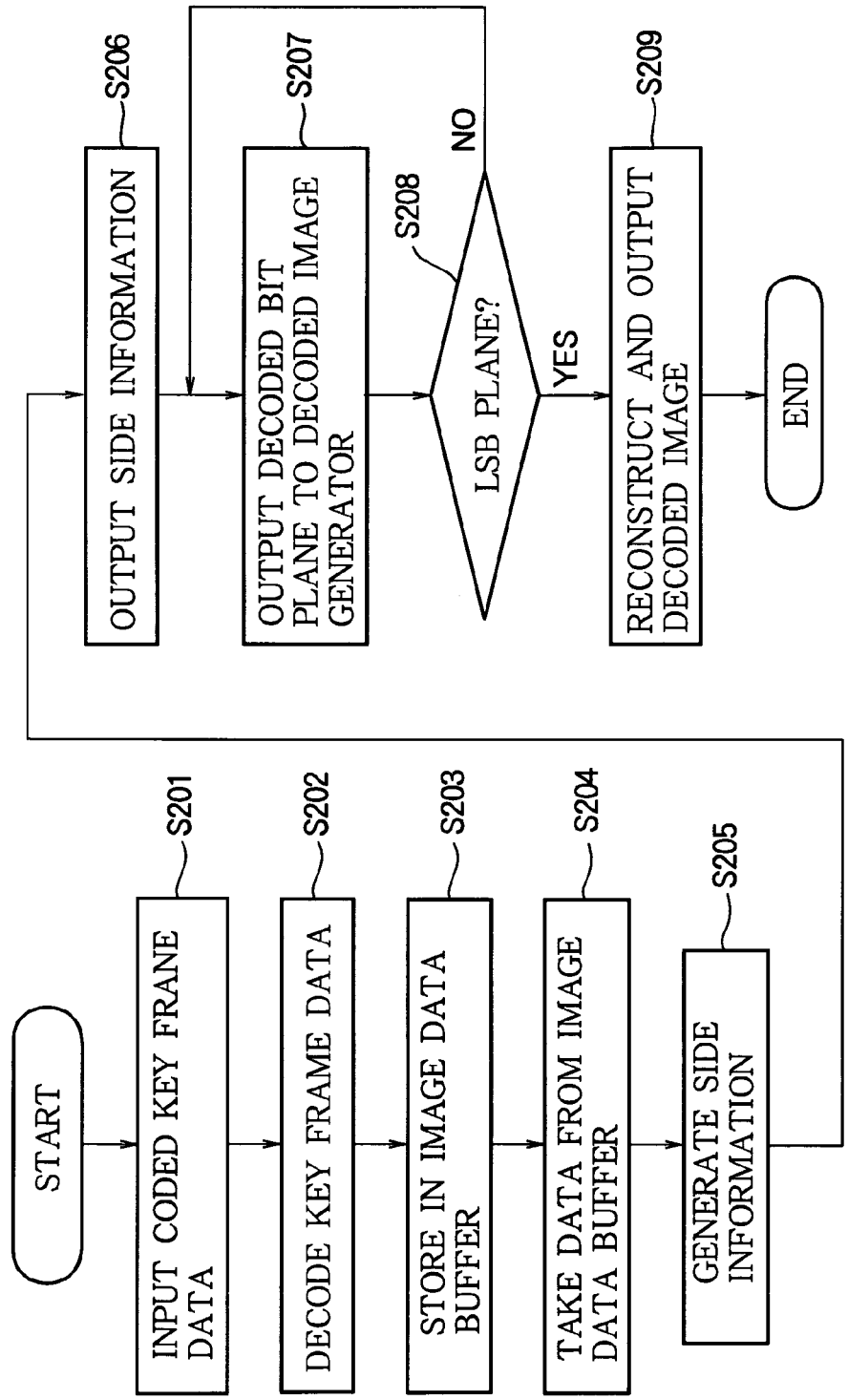
Figure 10:
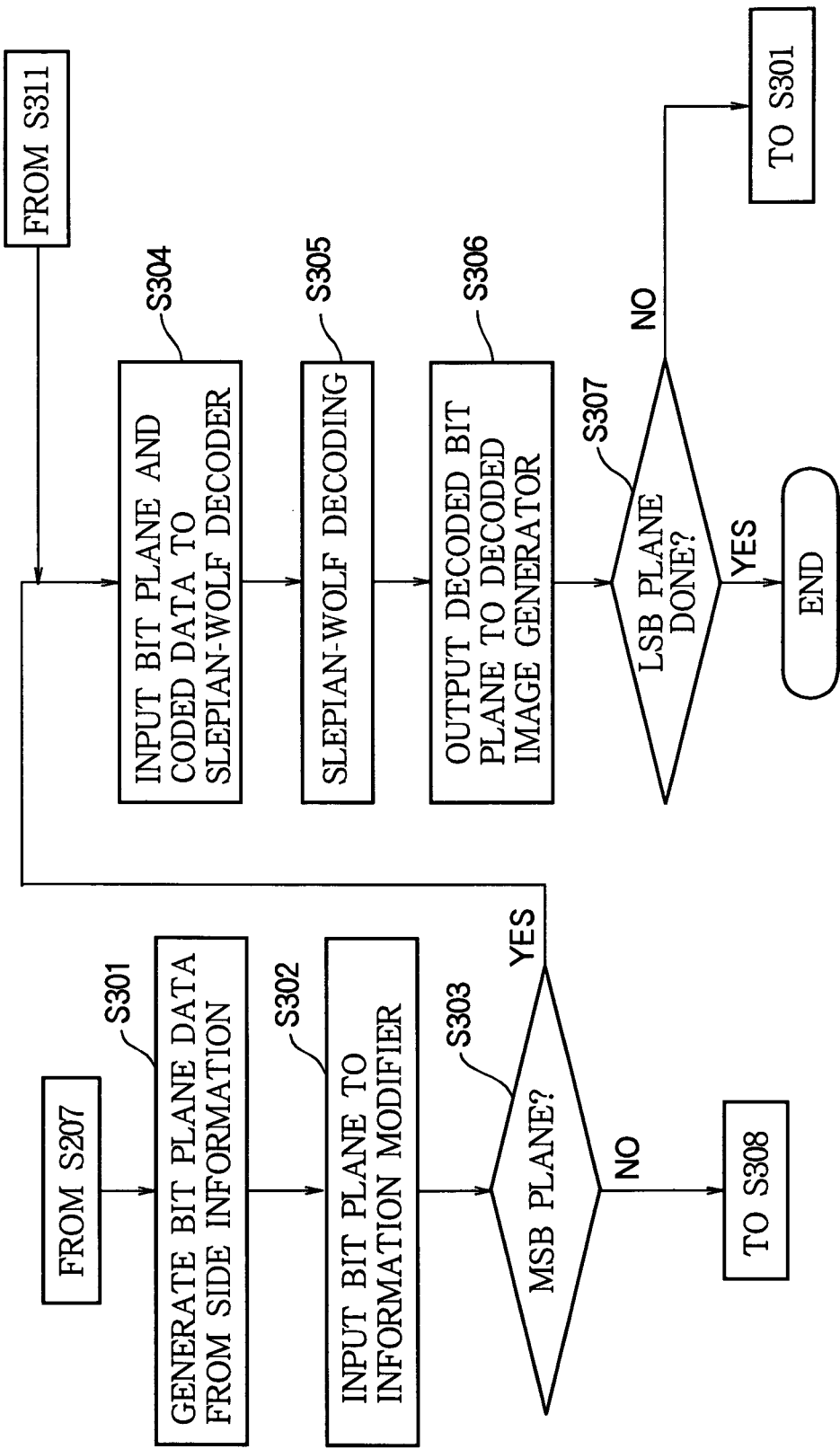

Referring to FIG. 9, coded key frame data are input to decoding unit 1 (step 201) and decoded by the key frame decoder 103 (step S202). The decoded key frame data are stored in the decoded image buffer 104 (step S203).

Next, part or all of the data stored in the decoded image buffer 104 are output to the side information generator 105 (step 204). The side information generator 105 generates side information by predicting the image data in the Wyner-Ziv frames (step S205), as in the first embodiment.

To decode a Wyner-Ziv frame, side information for two bit planes in the Wyner-Ziv frame is output from the side information generator 105 to the information bit generators 109 in decoding units 2 and 3 (step 206). The two decoding units 2, 3 operate concurrently, each decoding one bit plane, as described below. In special cases only one bit plane, e.g., the most significant bit plane, may be output and only one decoding unit may operate.

Decoded data are output from the Slepian-Wolf decoders 101 in decoding units 2 and 3 to the decoded image generator 102 in decoding unit 1 (step S207).

What happens next depends on whether the least significant bit plane has been decoded or not (step S208). If the least significant bit plane has been decoded, processing proceeds to step S209; otherwise, processing returns to step S207 to decode further bit planes.

In step S209, since all bit planes have been decoded, the decoded image generator 102 reconstructs and outputs the decoded image. This completes the decoding of the Wyner-Ziv frame.

The process carried out in decoding unit 2 will now be described with reference to the flowcharts in FIGS. 10 and 11.

From the side information output from the side information generator 105 in decoding unit 1, the information bit generator 109 in decoding unit 2 obtains information bits for one bit plane (step S301). In the present description, this bit plane is the first bit plane during the first processing iteration and the second bit plane during the second iteration. The bit plane information is passed to the information modifier 110 (step S302).

The information modifier 110 operates differently depending on whether the bit plane is the most significant bit plane or not (step S303). If the bit plane is the most significant bit plane, processing proceeds directly to step S304; otherwise, processing proceeds to step S308.

In step S304, the information modifier 110 passes the current bit plane data to the Slepian-Wolf decoder 101, which also receives Wyner-Ziv coded data from a coding system (not shown).

The Slepian-Wolf decoder 101 carries out a Slepian-Wolf decoding process on the current bit plane received from the information modifier 110 and the Wyner-Ziv coded data received from the coding system (step S305).

The resulting decoded bit plane data are output from the Slepian-Wolf decoder 101 to the decoded image generator 102 in decoding unit 1 (step 306, equivalent to step 207 in FIG. 9). Decoding unit 1 processes the decoded data as explained above.

The next step depends on whether the least significant bit plane has been decoded or not (step S307). If the least significant bit plane has not been decoded, the processing in FIG. 10 is iterated by returning to step S301. If the least significant bit plane has been decoded, the decoding of the frame has been completed and the processing in FIG. 10 ends.

If the bit plane to be processed is not the most significant bit plane, processing jumps from step S303 to steps S308 and S309, in which the prediction error locator 112 either compares the predicted and decoded values in a more significant bit plane to determine error locations as described in the first embodiment, or receives error location information from the prediction error locator 112 in decoding unit 3. Suppose, for example, that the second bit plane is to be decoded. The Slepian-Wolf decoder 101 in decoding unit 1 has already decoded the first bit plane, so the prediction error locator 112 in decoding unit 1 receives the decoded data for the first bit plane from the Slepian-Wolf decoder 101 (step S308).

The prediction error locator 112 compares the decoded data for the first bit plane with the side information supplied by the information bit generator 109 for the first bit plane to identify the locations of prediction errors (step S309) and reports the identified locations to the information modifier 110 (step S310).

The information modifier 110 now proceeds to modify the predicted bit values given by the side information for the second bit plane as described in the first embodiment, by deciding whether each bit is located at a reported error location (step S311), changing the predicted bit value to an erasure value if it is in a reported error location (step S312), and repeating these steps until the last bit in the bit plane has been processed (step S313). When all bits in the bit plane have been processed, the information modifier 110 returns to step S304 in FIG. 9 to pass the modified bit plane to the Slepian-Wolf decoder 101 for decoding.

The process carried out in decoding unit 3 will be described with reference to the flowcharts in FIGS. 10 and 11. The processing of the third bit plane will be described.

In decoding unit 3, the information bit generator 109 generates information bits for the third bit plane on the basis of the side information (step S301 in FIG. 10) and supplies the information bits to the information modifier 110 (step S302). Since the third bit plane is not the most significant bit plane, processing jumps from step S303 to step S308 in FIG. 11.

In step S308, the prediction error locator 112 in decoding unit 2 supplies the prediction error locations it identified in the first bit plane to the prediction error locator 112 in decoding unit 3. The prediction error locator 112 in decoding unit 3 takes these prediction error locations as received from the prediction error locator 112 in decoding unit 2 (step S309) and reports them to the information modifier 110 in decoding unit 3 (step S310).

Subsequent steps S111 and S113 are then carried out as described above to modify the predicted values in the third bit plane in decoding unit 3.

Figure 12:
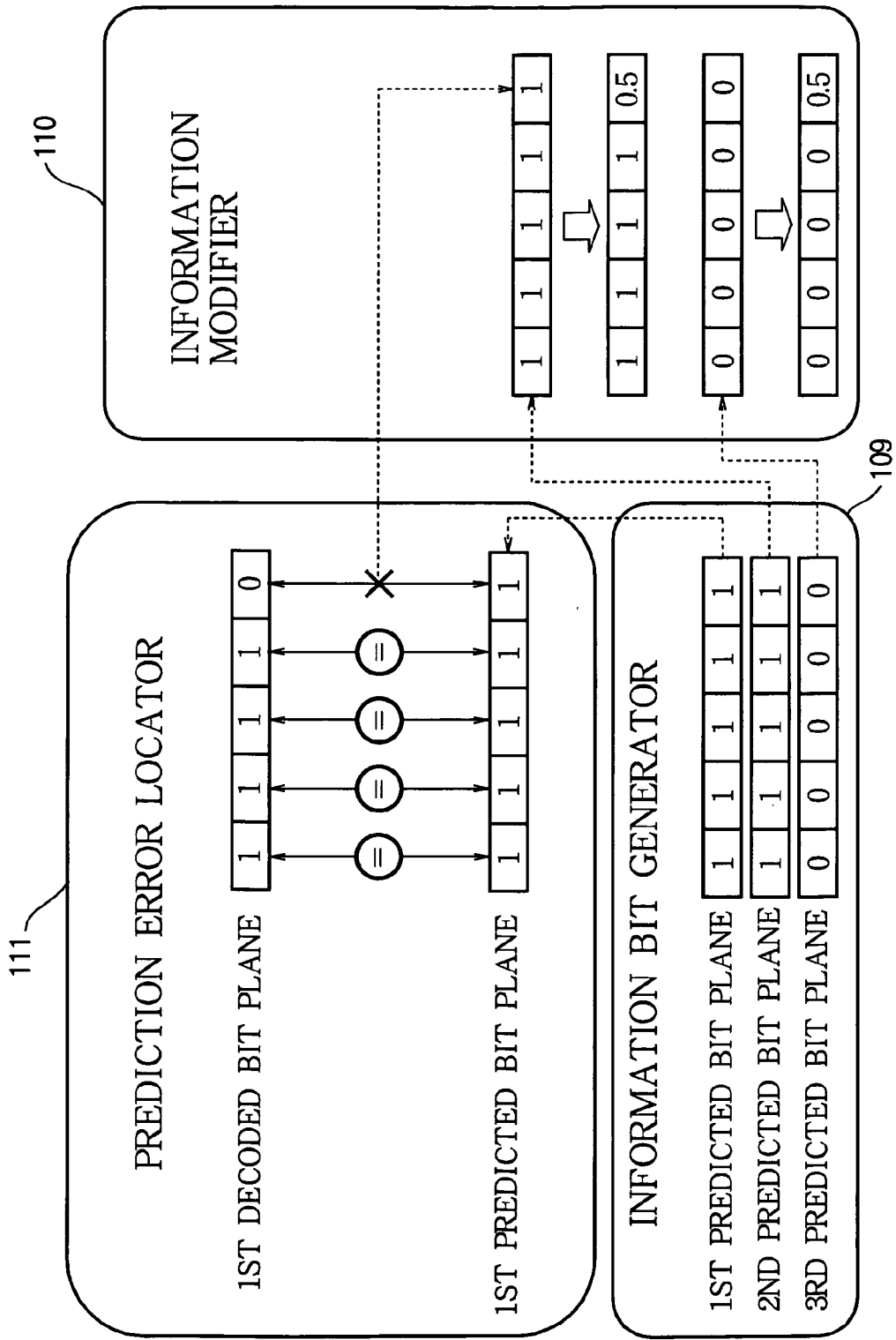
FIG. 12 is a diagram illustrating the identification of the locations of prediction error locations and the modification of bit plane values in the second embodiment.

FIG. 12 illustrates the identification of prediction error locations and modification of bit plane data in the second embodiment. In decoding unit 2, the information bit generator 109 supplies the predicted information bits (all 1's) for the first bit plane to the prediction error locator 111. The prediction error locator 112 compares them with the output of the Slepian-Wolf decoder 101 (four 1's followed by a 0) and identifies the fifth bit as the location of a prediction error (indicated by an X-mark). The prediction error locator 112 in decoding unit 2 notifies the information modifier 110 in decoding unit 2 and the prediction error locator 112 in decoding unit 3 of the identified prediction error location. The information modifier 110 in decoding unit 2 receives the predicted data for the second bit plane (all 1's) from the information bit generator 109 and changes the fifth bit to the erasure value (0.5). The information modifier 110 in decoding unit 3 receives the predicted data for the third bit plane (all 0's) from the information bit generator 109, receives the error location report from the prediction error locator 112 in decoding unit 3, and changes the fifth bit to the erasure value (0.5).

Compared with the first embodiment, the second embodiment allows a bit plane to be processed without waiting for the decoding of the next most significant bit plane, by using a still higher bit plane that has already been decoded to identify prediction error locations. This enables bit planes to be processed in parallel, and in general makes the design of the decoder more flexible. In the preceding example, after the most first (e.g., most significant) bit plane has been processed, the second and third bit planes can be processed concurrently, information bits in both planes being erased on the basis of prediction error locations identified in the first bit plane. Next, the fourth and fifth bit planes can be processed concurrently on the basis of prediction error locations identified in the second and third bit planes, and so on. The decoding process can be speeded up by nearly a factor of two in this way.

Additional decoding unit can by provided so that more bit planes can be processed concurrently to speed up the decoding process still further.

The Slepian-Wolf decoding method is not limited to the BCJR algorithm mentioned in the first embodiment. The log-MAP algorithm or max-log-MAP algorithm may be used instead, or more generally any type of trellis decoding algorithm that traces paths through multiple inferred encoder states may be used.

The side information for Wyner-Ziv frames may be predicted by any method from any image data stored in the decoded image buffer. Motion estimation may be based on already decoded Wyner-Ziv frames as well as key frames. Alternatively, motion estimation may be skipped and the immediately preceding decoded image data may be used as the side information.

When a prediction error is identified in a given bit plane, the bits in the same location in all less significant bit planes may be modified, instead of modifying just the bit in the same location in the next one bit plane (as in FIG. 7) or two bit planes (as in FIG. 12).

The parallel processing scheme in the second embodiment may be modified in various ways. In one variation, decoding units 1 and 2 are combined into a single decoding unit. In another variation, decoding units 2 and 3 operate independently, without exchange error location information. For example, decoding unit 2 may process the first and second bit planes while decoding unit 3 processes the third and fourth bit planes.

The decoding systems 10 and 20 described in the first and second embodiments may be implemented in hardware or software or a combination thereof. In a typical hardware-software implementation, the hardware includes one or more processing units and various types of memory (ROM, RAM, EEPROM, etc.), and the software includes programs, stored in the memory, that are executed by the processing units to perform the functions of various of the blocks in FIG. 3 or FIG. 8.

In the first and second embodiments, the information modifier 110 erases predicted values to values equal to 0.5, halfway between the two possible bit values of 0 and 1, but instead of 0.5, the erasure value may be another prescribed value such as 0.8 and 0.4. When a predicted value is erased, it may be changed to a fixed erasure value or to a variable value obtained by weighting a fixed value. For example, the erasure value may be weighted by taking bits around the identified location of the prediction error into consideration.

Those skilled in the art will recognize that further variations are possible within the scope of the invention, which is defined in the appended claims.

What is claimed is:

1. An apparatus for modifying predicted values in a predicted image for input to a decoder, comprising:
    an information bit generator for obtaining information bit planes one by one from the predicted image, in sequence from a most significant information bit plane to a least significant information bit plane;
    a prediction error locator for receiving decoded bit planes from the decoder, comparing each one of the decoded bit planes with an equally significant one of the information bit planes obtained by the information bit generator to identifying locations of prediction errors; and
    an information modifier for modifying values in each one of the information bit planes obtained by the information bit generator at the locations of prediction errors identified by the prediction error locator in a more significant bit plane, and supplying the information bit planes, thus modified, to the decoder,
    wherein when the prediction error locator identifies the location of a prediction error in one information bit plane, the information modifier modifies the bit values in the identified location in all information bit planes less significant than the one information bit plane.

2. The apparatus of claim 1, wherein the information modifier modifies the bit values in the identified locations to intermediate values intermediate between normal bit values.

3. The apparatus of claim 2, wherein the intermediate values are halfway between the normal bit values.

4. A method of modifying predicted values in a predicted image for input to a decoder, comprising:

obtaining a most significant information bit plane from the predicted image;

supplying the most significant information bit plane to the decoder to be decoded;

obtaining subsequent information bit planes from the predicted image in descending order of significance;

modifying each of the subsequent information bit planes at locations of prediction errors identified in a preceding more significant information bit plane;

supplying each of the subsequent information bit planes, thus modified, to the decoder to be decoded;

obtaining decoded bit planes from the decoder; and comparing the decoded bit plane with the information bit plane of equal significance to identify the locations of the prediction errors, wherein when the location of a prediction error in one information bit plane is identified, the bit values in the identified location in all information bit planes less significant than the one information bit plane are modified.

5. The method of claim 4, wherein the bit values in the identified locations are modified to intermediate values intermediate between normal bit values.

6. The method of claim 5, wherein the intermediate values are halfway between the normal bit values.

* * * * *